(12) United States Patent
Shimizu et al.

(10) Patent No.: US 12,588,468 B2
(45) Date of Patent: Mar. 24, 2026

(54) OVERHEAD TRANSPORT VEHICLE

(71) Applicant: MURATA MACHINERY, LTD., Kyoto (JP)

(72) Inventors: Yuji Shimizu, Ise (JP); Seiji Yamagami, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 292 days.

(21) Appl. No.: 18/273,062

(22) PCT Filed: Nov. 16, 2021

(86) PCT No.: PCT/JP2021/042080
§ 371 (c)(1),
(2) Date: Jul. 19, 2023

(87) PCT Pub. No.: WO2022/176288
PCT Pub. Date: Aug. 25, 2022

(65) Prior Publication Data
US 2024/0128113 A1 Apr. 18, 2024

(30) Foreign Application Priority Data

Feb. 17, 2021 (JP) ................................. 2021-023227

(51) Int. Cl.
*H10P 72/00* (2026.01)
*B66C 13/46* (2006.01)
(Continued)

(52) U.S. Cl.
CPC .............. *H10P 72/53* (2026.01); *B66C 13/46* (2013.01); *B66C 13/48* (2013.01);
(Continued)

(58) Field of Classification Search
CPC ............. H01L 21/67259; H01L 21/677; H01L 21/6773; G01B 11/026; B65G 1/00;
(Continued)

(56) References Cited

U.S. PATENT DOCUMENTS 10,519,008 B1 * 12/2019 Riley ...................... B66C 13/44
10,934,138 B2 * 3/2021 Bohnacker .............. B66C 13/46
(Continued)

FOREIGN PATENT DOCUMENTS

JP 2001261284 A 9/2001
JP 2009-155056 A 7/2009
(Continued)

OTHER PUBLICATIONS

Official Communication issued in corresponding European Patent Application No. 21926716.8, mailed on Sep. 23, 2024, 8 pages.
(Continued)

*Primary Examiner* — Emmanuel M Marcelo
(74) *Attorney, Agent, or Firm* — Keating & Bennett, LLP

(57) ABSTRACT

An overhead transport vehicle includes: a holding unit that is provided to be liftable and lowerable and configured to hold an article; a three-dimensional ranging sensor that has a detection range to include surroundings of a lower space formed directly below the article held by the holding unit; and a control device that is configured to determine presence or absence of an obstacle based on a detection result of the three-dimensional ranging sensor.

6 Claims, 5 Drawing Sheets

(51) Int. Cl.

| | |
|---|---|
| *B66C 13/48* | (2006.01) |
| *H10P 72/30* | (2026.01) |
| *H10P 72/50* | (2026.01) |
| *B66C 19/00* | (2006.01) |

(52) U.S. Cl.
CPC ...... *H10P 72/3206* (2026.01); *H10P 72/3221* (2026.01); *B66C 19/00* (2013.01)

(58) Field of Classification Search
CPC .................. B65G 1/04; B65G 1/0457; B65G 2201/0297; B65G 2203/041; B65G 2203/042
See application file for complete search history.

(56) References Cited

U.S. PATENT DOCUMENTS

| | | | | |
|---|---|---|---|---|
| 10,937,187 | B2 * | 3/2021 | Alt | G06T 7/70 |
| 10,968,083 | B2 * | 4/2021 | Schoerghofer | B66C 13/46 |
| 11,270,450 | B2 * | 3/2022 | Kosaka | G06T 7/11 |
| 2003/0202868 | A1 * | 10/2003 | Bachrach | H01L 21/67733 |
| | | | | 414/277 |
| 2014/0112741 | A1 * | 4/2014 | Yoshioka | H01L 21/67727 |
| | | | | 414/222.01 |
| 2015/0249821 | A1 * | 9/2015 | Tanizumi | B60R 1/31 |
| | | | | 348/46 |
| 2020/0223640 | A1 | 7/2020 | Shin et al. | |
| 2020/0270102 | A1 | 8/2020 | Wada | |
| 2022/0059380 | A1 | 2/2022 | Wada | |
| 2022/0269280 | A1 | 8/2022 | Yamagami et al. | |

FOREIGN PATENT DOCUMENTS

| | | | |
|---|---|---|---|
| JP | 2014-106176 A | | 6/2014 |
| JP | 2018193169 A | * | 12/2018 |
| WO | 2017/199593 A1 | | 11/2017 |
| WO | 2020121765 A1 | | 6/2020 |

OTHER PUBLICATIONS

Official Communication issued in International Patent Application No. PCT/JP2021/042080, mailed on Aug. 31, 2023.

English translation of Official Communication issued in International Patent Application No. PCT/JP2021/042080, mailed on Feb. 1, 2022.

Official Communication issued in International Patent Application No. PCT/JP2021/042080, mailed on Feb. 1, 2022.

Official Communication issued in corresponding Singaporean Patent Application No. 11202304696R, mailed on Dec. 27, 2025, 7 pages.

\* cited by examiner

OVERHEAD TRANSPORT VEHICLE

BACKGROUND OF THE INVENTION

1. Field of the Invention

One aspect of the present invention relates to an overhead transport vehicle.

2. Description of the Related Art

As a technology related to overhead transport vehicles, a transport vehicle described in International Publication No. WO 2017/199593, for example, is known. The transport vehicle described in International Publication No. WO 2017/199593 includes a body section, an elevating platform (holding unit) having a holding section that holds an article, a lifting drive unit that lifts and lowers the elevating platform by unwinding and winding a flexible hanging member, and a look-down sensor installed in the lifting drive unit that emits a directional detection wave, such as a laser beam. In the transport vehicle described in International Publication No. WO 2017/199593, a detection wave is emitted from the look-down sensor toward the vicinity of a descent destination of the elevating platform to determine the presence or absence of a foreign object (obstacle).

SUMMARY OF THE INVENTION

In the overhead transport vehicle described above, there is a possibility that, for example, a protruding portion of peripheral equipment in close proximity to the elevating holding unit may be misjudged as an obstacle. In addition, the overhead transport vehicle described above may not be able to reliably detect an obstacle due to the narrow detection range of the look-down sensor.

Therefore, preferred embodiments of the present invention provide overhead transport vehicles each capable of accurately and reliably determining the presence or absence of an obstacle.

An overhead transport vehicle according to an aspect of a preferred embodiment of the present invention includes a holder to be liftable and lowerable and to hold an article, a three-dimensional ranging sensor that has a detection range to include surroundings of a lower space directly below the article held by the holder, and a controller configured or programmed to determine presence or absence of an obstacle based on a detection result of the three-dimensional ranging sensor.

In this overhead transport vehicle, the three-dimensional ranging sensor can detect an object in a wider detection range than a look-down sensor or the like does. In addition, since the three-dimensional ranging sensor can detect an object in the detection range in three dimensions, it is possible to reduce or prevent misjudgments such as determining that a protruding portion of peripheral equipment or the like, located at a high position, for example, is an obstacle. Therefore, it is possible to accurately and reliably determine the presence or absence of an obstacle.

In an overhead transport vehicle according to an aspect of a preferred embodiment of the present invention, the detection range of the three-dimensional ranging sensor may include at least one of the holder and the article held by the holder, and the controller may determine at least one of swaying, tilting, and rotating of the article held by the holder based on a detection result of the three-dimensional ranging sensor. In this case, during the transfer of the article, the lifting, lowering, or the like of the holder can be controlled using, for example, the determination result of at least on one of the swaying, tilting, and rotating of the article, making it possible to prevent an error in the transfer of the article.

In an overhead transport vehicle according to an aspect of a preferred embodiment of the present invention, at least one of the holder and the article held by the holder may include a light emitter, and the three-dimensional ranging sensor may detect light emitted by the light emitter. This makes it possible to determine at least one of swaying, tilting, and rotating of an article using the light emitted by the light emitter.

In an overhead transport vehicle according to an aspect of a preferred embodiment of the present invention, at least one of the holder and the article held by the holder may include an AR marker, and the three-dimensional ranging sensor may detect the AR marker. This makes it possible to determine at least one of swaying, tilting, and rotating of an article using the AR marker.

In an overhead transport vehicle according to an aspect of a preferred embodiment of the present invention, the three-dimensional ranging sensor may include a stereo camera. In this case, even if there is a device using another infrared sensor or the like in the surroundings of the overhead transport vehicle, the stereo camera does not interfere with the other infrared sensor or the like, so an adverse effect of the three-dimensional ranging sensor on the other infrared sensor or the like can be reduced or prevented.

In an overhead transport vehicle according to an aspect of a preferred embodiment of the present invention, the stereo camera may be installed at a position above the holder to have an overhead view of the holder, and may include, in the angle of view, the holder at its lowest position. In this case, the stereo camera can be effectively used as a three-dimensional ranging sensor.

An overhead transport vehicle according to an aspect of a preferred embodiment of the present invention may include a lifter to lift and lower the holder, in which the three-dimensional ranging sensor is included in the lifter at a position directly above the article held by the holder. In this case, an effective arrangement configuration of the three-dimensional ranging sensor can be achieved.

An overhead transport vehicle according to an aspect of a preferred embodiment of the present invention may include a gyro sensor and an acceleration sensor to detect swaying and tilting of the three-dimensional ranging sensor. In this case, it is possible to accurately and reliably determine the presence or absence of an obstacle.

According to an aspect of the present invention, it is possible to provide an overhead transport vehicle capable of accurately and reliably determining the presence or absence of an obstacle.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the drawings. Like elements or corresponding elements are designated by like reference signs, and duplicate description is omitted.

Figure 1:
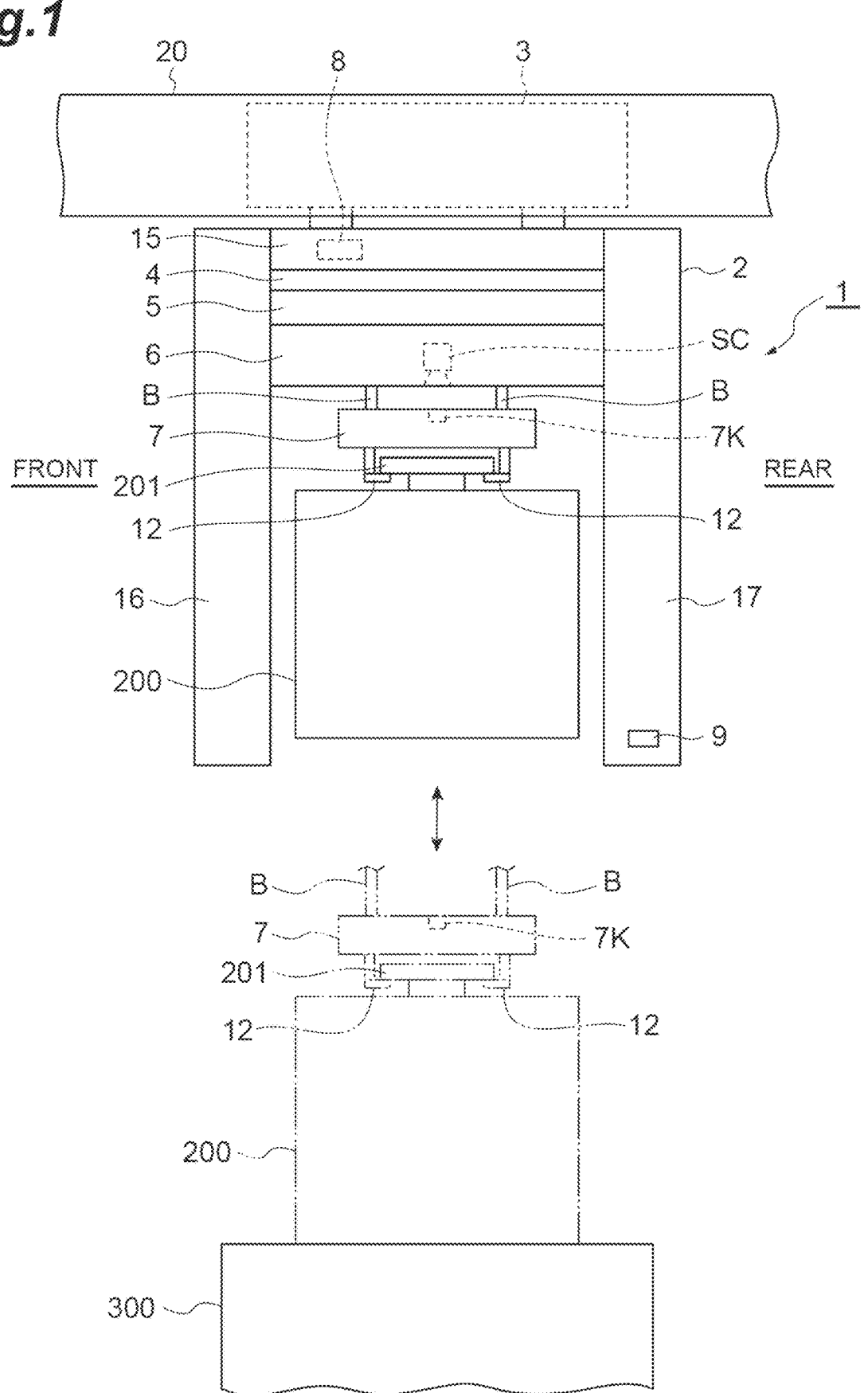
FIG. 1 is a side view illustrating an overhead transport vehicle according to a preferred embodiment of the present invention.

As illustrated in FIG. 1, an overhead transport vehicle 1 according to the present preferred embodiment travels along a track 20 installed near a ceiling of a clean room in which semiconductor devices are manufactured. The overhead transport vehicle 1 transports a front opening unified pod (FOUP) (article) 200 housing a plurality of semiconductor wafers, and transfers the FOUP 200 to a load port (transfer part) 300 and the like provided on a processing device configured to perform various kinds of processing on the semiconductor wafers.

The overhead transport vehicle 1 includes a frame unit 2, a traveling unit 3, a lateral unit 4, a theta unit 5, a lifting drive unit 6, a holding unit 7, a transport vehicle controller (control unit) 8, and a communication unit 9. The frame unit 2 includes a center frame 15, a front frame 16, and a rear frame 17. The front frame 16 extends downward from an end portion on a front side of the center frame 15 (front side in a traveling direction of the overhead transport vehicle 1). The rear frame 17 extends downward from an end portion on a rear side of the center frame 15 (rear side in the traveling direction of the overhead transport vehicle 1).

The traveling unit 3 is disposed on an upper side of the center frame 15. For example, the traveling unit 3 travels along the track 20 by receiving electric power supplied from a high-frequency current line installed along the track 20 in a non-contact manner. The lateral unit 4 is disposed on a lower side of the center frame 15. The lateral unit 4 causes the theta unit 5, the lifting drive unit 6, and the holding unit 7 to move in a lateral direction (a lateral side in the traveling direction of the overhead transport vehicle 1). The theta unit 5 is disposed on a lower side of the lateral unit 4. The theta unit 5 turns the lifting drive unit 6 and the holding unit 7 in a horizontal plane.

The lifting drive unit 6 is disposed on a lower side of the theta unit 5. The lifting drive unit 6 causes the holding unit 7 to be lifted and lowered. The lifting drive unit 6 lifts and lowers the holding unit 7 by winding or unwinding belts B connected to the holding unit 7. The holding unit 7 is liftable and lowerable. The holding unit 7 is disposed on a lower side of the lifting drive unit 6. The holding unit 7 is suspended by a plurality of belts B. The holding unit 7 performs lifting and lowering by winding and unwinding of the belts B by the lifting drive unit 6. The holding unit 7 holds (grips) a flange 201 of the FOUP 200. The holding unit 7 includes a pair of grippers 12, 12. The pair of grippers 12, 12 is opened or closed by a driving motor and a link mechanism, for example.

The transport vehicle controller 8 is disposed in the center frame 15, for example. The transport vehicle controller 8 is an electronic control unit including a central processing unit (CPU), a read only memory (ROM), a random access memory (RAM), and the like. The transport vehicle controller 8 is configured or programmed to control respective portions and functions of the overhead transport vehicle 1.

By way of example, the overhead transport vehicle 1 configured as described above operates as follows. In a case of transferring the FOUP 200 to the overhead transport vehicle 1 from the load port 300, first, the overhead transport vehicle 1 not holding the FOUP 200 is stopped at a position corresponding to the load port 300. At this time, in a case where the position of the holding unit 7 to be lowered deviates from a predetermined position with respect to the load port 300, the lateral unit 4 and the theta unit 5 are driven to adjust the horizontal position and the horizontal angle of the holding unit 7. Subsequently, the lifting drive unit 6 lowers the holding unit 7, and causes the holding unit 7 to hold the flange 201 of the FOUP 200 placed on the load port 300. Subsequently, the lifting drive unit 6 lifts the holding unit 7 up to its most lifted position.

In a case of transferring the FOUP 200 from the overhead transport vehicle 1 to the load port 300, the overhead transport vehicle 1 holding the FOUP 200 is stopped at a position corresponding to the load port 300. At this time, in a case where the position of the holding unit 7 to be lowered deviates from a predetermined position with respect to the load port 300, the lateral unit 4 and the theta unit 5 are driven to adjust the horizontal position and the horizontal angle of the holding unit. Subsequently, the lifting drive unit 6 lowers the holding unit 7, the FOUP 200 is placed on the load port 300, and the holding unit 7 releases the holding of the flange 201. Subsequently, the lifting drive unit 6 lifts the holding unit 7 up to the most lifted position.

Figure 2:
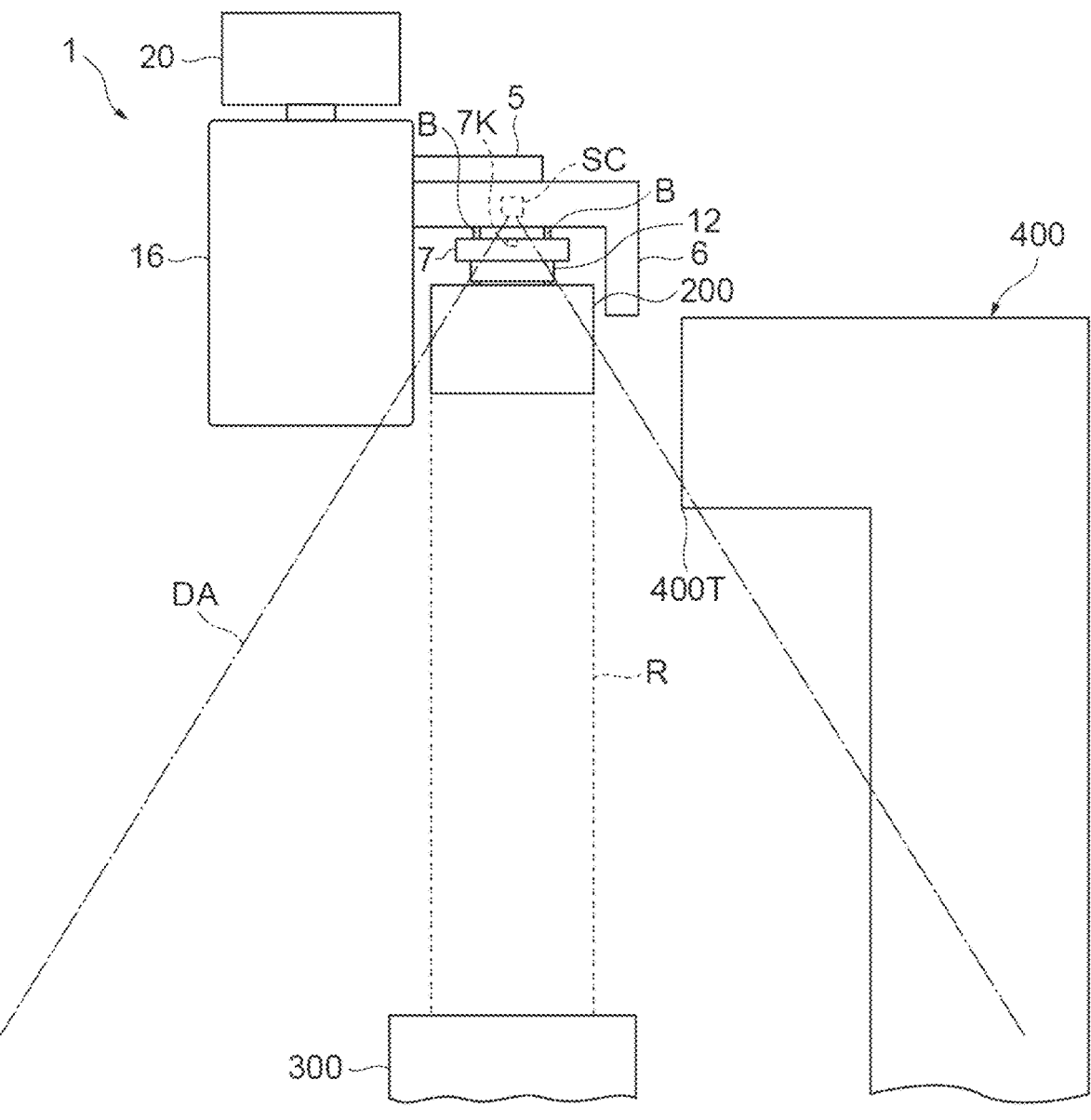
FIG. 2 is a front view illustrating a detection range of a stereo camera in the overhead transport vehicle in FIG. 1.
Figure 3:
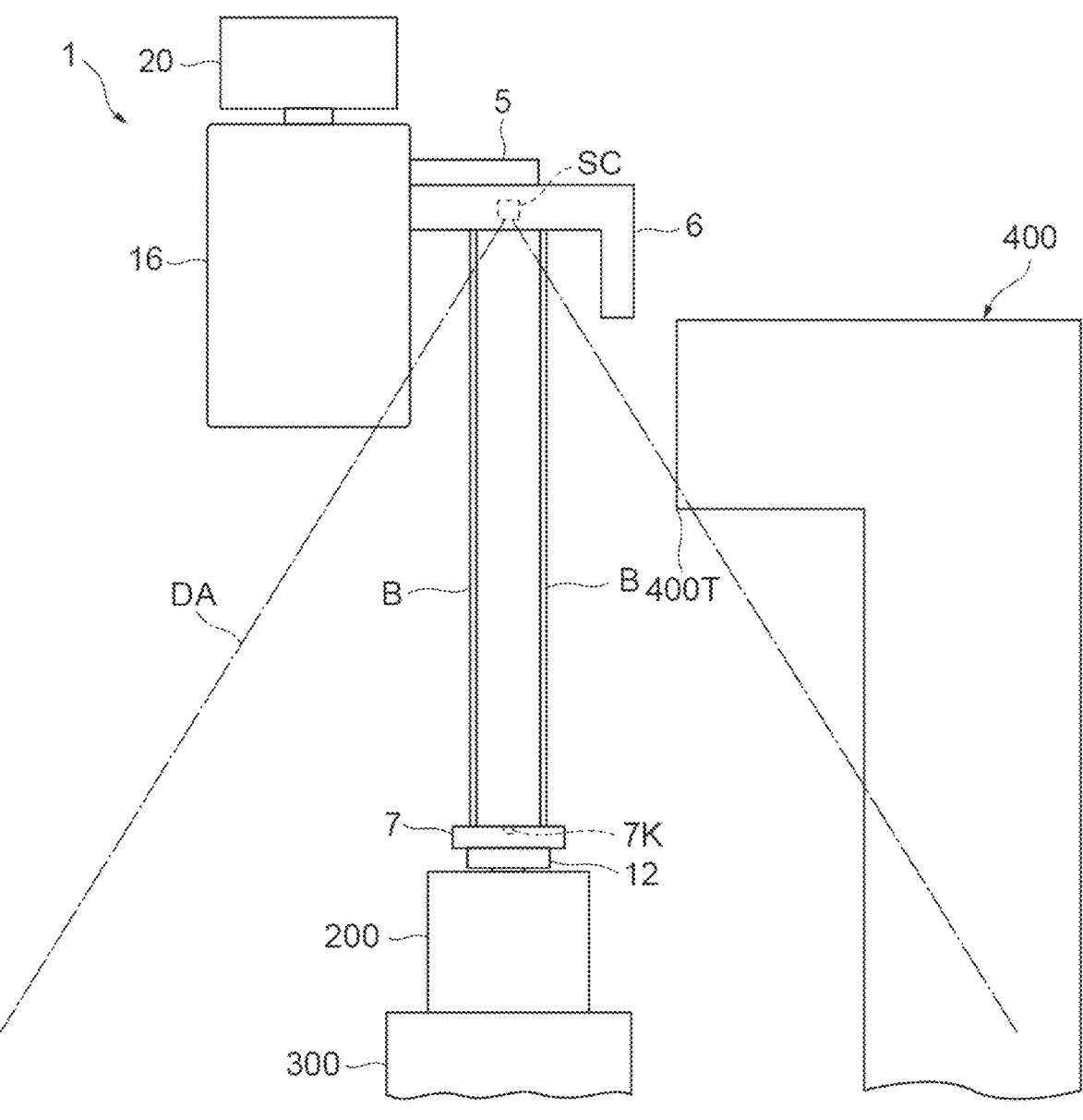
FIG. 3 is a front view illustrating the detection range of the stereo camera in the overhead transport vehicle in FIG. 1.

Here, the overhead transport vehicle 1 includes a light emitter 7K and a stereo camera SC, as illustrated in FIGS. 2 and 3. The light emitter 7K is provided in the holding unit 7. The light emitter 7K is disposed at a position at which the light emitter 7K is in an angle of view of the stereo camera SC. The light emitter 7K is located on the upper side of the holding unit 7. The light emitter 7K emits upward a laser beam having excellent straightness. The light emitter 7K emits infrared light. For example, an infrared LED is used as the light emitter 7K. The position at which the light emitter 7K is provided is not particularly limited, and may be within a detection range of the stereo camera SC.

The stereo camera SC is a device that can recognize an object in its detection range and acquire distance information to the object by simultaneously capturing images from several different directions using a plurality of cameras. As the stereo camera SC here, a passive stereo camera that captures ambient light is used. The stereo camera SC defines and functions as a three-dimensional ranging sensor. Various known image recognition methods and image processing methods can be used for object recognition. The distance information of an object in the present preferred embodiment corresponds to the height information of the object.

The stereo camera SC is installed at a position above the holding unit 7 to be able to have an overhead view of the holding unit 7. The stereo camera SC is disposed in the lifting drive unit 6 at a position directly above the FOUP 200 held by the holding unit 7. In one example illustrated in the diagram, the stereo camera SC is provided in a center portion of the lifting drive unit 6, facing downward.

A detection range DA of the stereo camera SC described above includes at least the holding unit 7, the FOUP 200 held by the holding unit 7, and the surroundings of a lower space R formed directly below the FOUP 200 held by the holding unit 7. The lower space R three-dimensionally defines a route to lower the FOUP 200 to the load port 300. The lower space R includes a lifting/lowering path of the FOUP 200 when the holding unit 7 is lifted and lowered to transfer the FOUP 200. The stereo camera SC is capable of capturing an overhead view of the surroundings of the load port 300. The stereo camera SC includes, in its angle of view, the holding unit 7 at its lowest position (holding unit 7 at the height position at which the holding unit 7 holds the FOUP 200 placed on the load port 300). The stereo camera SC is capable of detecting the emission (infrared light) of the light emitter 7K.

The transport vehicle controller 8 determines the presence or absence of an obstacle based on a detection result of the stereo camera SC. Obstacles include, for example, people, suspension bars, stepladder tops, rolling towers, and the like in the surroundings of the load port 300. As an example, the transport vehicle controller 8 determines, to be an obstacle, an object recognized by the stereo camera SC when it determines, based on the object and its distance information, that the object is interfering, or highly likely to be interfering, with the lower space R. Various known determination methods can be used to determine whether an object is interfering (or highly likely to be interfering) with the lower space R.

The transport vehicle controller 8 determines the swaying, tilting, and rotating of the FOUP 200 held by the holding unit 7 based on a detection result of the stereo camera SC. As an example, the transport vehicle controller 8 determines whether the FOUP 200 is swaying more than a predetermined amount and its swaying speed from the behavior of the light emitted by the light emitter 7K detected by the stereo camera SC. The swaying of the FOUP 200 can be determined based on how much the laser beam emitted from the light emitter 7K is displaced from a target axis. As an example, the transport vehicle controller 8 determines whether the FOUP 200 is tilted by more than a predetermined amount based on the position of the light emitted by the light emitter 7K detected by the stereo camera SC. As an example, the transport vehicle controller 8 determines whether the FOUP 200 is at a position where it has rotated more than a predetermined amount around an axis in a vertical direction, from the position of the light emitted by the light emitter 7K detected by the stereo camera SC.

The transport vehicle controller 8 transmits determination result information on the presence or absence of an obstacle to a higher-level control device (not illustrated) or the like. The higher-level control device informs an operator of the determination result information on the presence or absence of an obstacle. When the transport vehicle controller 8 determines that there is an obstacle, it stops or prohibits the lifting and lowering of the holding unit 7. The transport vehicle controller 8 controls the transfer operation of the FOUP 200 based on the determination result information on the swaying, tilting, and rotating of the FOUP 200 held by the holding unit 7. For example, the transport vehicle controller 8 controls at least one of the lifting and lowering of the holding unit 7, the drive of the lateral unit 4, and the drive of the theta unit 5 so that the swaying of the FOUP 200 is reduced, the tilting of the FOUP 200 is reduced, and the rotating of the FOUP 200 is reduced. When any one of the swaying, tilting, and rotating of the FOUP 200 held by the holding unit 7 exceeds a predetermined amount, the transport vehicle controller 8 stops or prohibits the lifting and lowering of the holding unit 7, and the higher-level control device informs the operator of the error information on the swaying, tilting, and rotating.

In the overhead transport vehicle 1 described above, the stereo camera SC can detect an object in the wider detection range DA than a look-down sensor or the like does. The stereo camera SC allows range detection to be performed in planes. In addition, since the stereo camera SC can detect an object in the detection range in three dimensions, it is possible to reduce or prevent misjudgments such as determining that a protruding portion 400T (refer to FIGS. 2 and 3) of peripheral equipment 400 or the like, located at a high position, for example, is an obstacle. Therefore, with the overhead transport vehicle 1, it is possible to accurately and reliably determine the presence or absence of an obstacle.

In the overhead transport vehicle 1, the stereo camera SC includes the holding unit 7 and the FOUP 200 held by the holding unit 7 in its detection range. The transport vehicle controller 8 determines the swaying, tilting, and rotating of the FOUP 200 held by the holding unit 7 based on a detection result of the stereo camera SC. In this case, a wider range and higher accuracy of detection of the swaying, tilting, and rotating of the FOUP 200 can be achieved. In addition, during the transfer of the FOUP 200, the lifting, lowering, or the like of the holding unit 7 can be controlled using the determination result of the swaying, tilting, and rotating of the FOUP 200, making it possible to prevent an error in the transfer of the FOUP 200.

In the overhead transport vehicle 1, the holding unit 7 includes the light emitter 7K, and the stereo camera SC detects the light emitted by this light emitter 7K. This makes it possible to determine the swaying, tilting and rotating of the FOUP 200 using the light emitted by the light emitter 7K.

The overhead transport vehicle 1 uses the stereo camera SC as a three-dimensional ranging sensor. In this case, even if there is a device using another infrared sensor or the like in the surroundings of the overhead transport vehicle 1, the stereo camera SC does not interfere with the other infrared sensor or the like, so an adverse effect of the stereo camera SC on the other infrared sensor or the like can be reduced or prevented. By using a stereo camera SC as a three-dimensional ranging sensor, it is possible to determine the presence or absence of an obstacle without being affected by another infrared sensor in the surroundings. In addition, the use of the stereo camera SC as a three-dimensional ranging sensor makes it possible to recognize an obstacle in a simplified manner.

In the overhead transport vehicle 1, the stereo camera SC is installed at a position above the holding unit 7 to have an overhead view of the holding unit 7, and include, in the angle of view, the holding unit 7 at its lowest position. In this case, the stereo camera SC can be effectively used as a three-dimensional ranging sensor.

The overhead transport vehicle 1 includes the lifting drive unit 6 that lifts and lowers the holding unit 7. The stereo camera SC is disposed in the lifting drive unit 6 at a position directly above the FOUP 200 held by the holding unit 7. In this case, an effective arrangement configuration of the stereo camera SC can be achieved.

Although preferred embodiments have been described above, an aspect of a preferred embodiment of the present invention is not limited to the preferred embodiments, and various modifications may be made within the scope not departing from the gist of the present invention.

In the above preferred embodiments, the FOUP 200 is targeted as an article, but the article is not particularly limited, and may be any object that is transported by the overhead transport vehicle 1. In the above preferred embodiments, the stereo camera SC is used as a three-dimensional ranging sensor, but the three-dimensional ranging sensor is not particularly limited. As a three-dimensional ranging sensor, for example, a time of flight (TOF) camera may be used, an infrared ranging sensor with an infrared transmitter and receiver may be used, or a plurality of laser rangefinders or three-dimensional light detection and ranging (3DLI-DAR) may be used.

In the above preferred embodiments, the position at which the stereo camera SC is disposed is not particularly limited, and it is sufficient if it is disposed to include the surroundings of the lower space R in its detection range. In the above preferred embodiments, the swaying, tilting, and rotating of the FOUP 200 are determined by the transport vehicle controller 8, but only at least one of the swaying, tilting, and rotating of the FOUP 200 may be determined.

Figure 4:
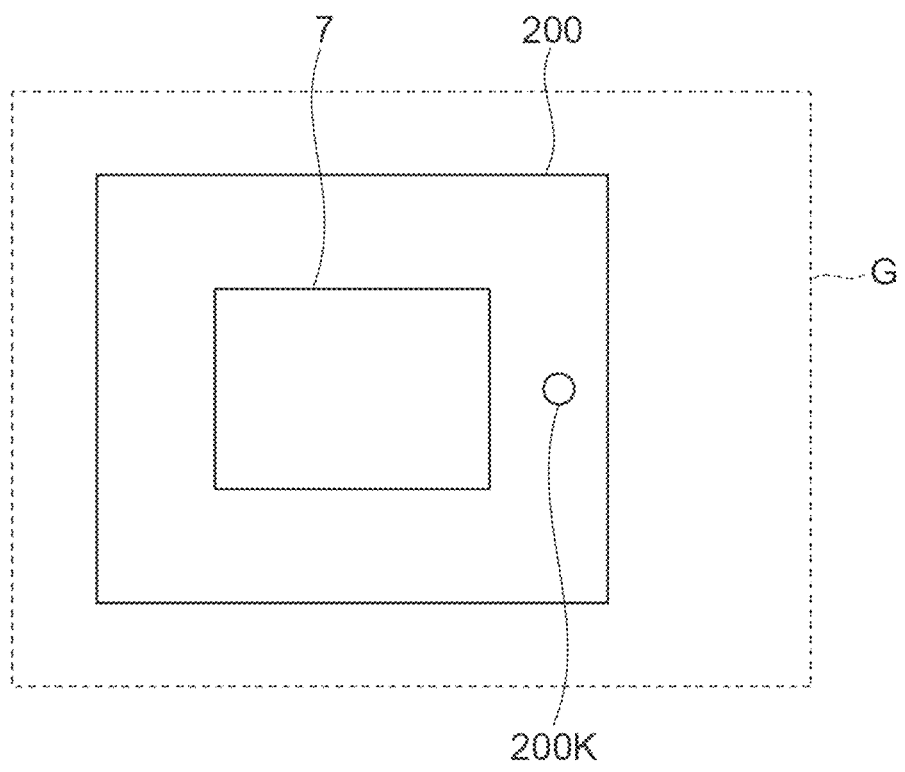
FIG. 4 is a diagram illustrating an image including a light emitter according to a modification of a preferred embodiment of the present invention.

In the above preferred embodiments, the holding unit 7 includes the light emitter 7K, but instead of or in addition to this, the FOUP 200 may include a light emitter 200K, as illustrated for example in FIG. 4. In this case, the stereo camera SC detects light emitted by the light emitter 200K. The light emitter 200K is disposed in the upper portion of the FOUP 200 so that it is reflected in an image G captured by the stereo camera SC. In this case, it is possible to determine at least one of the swaying, tilting, and rotating of the light emitter 200K using the light emitted by the light emitter 200K detected by the stereo camera SC. The position at which the light emitter 200K is provided is not particularly limited, and may be within a detection range of the stereo camera SC. A plurality of light emitters 7K and 200K may be provided and may have unique light emitting shapes.

Figure 5:
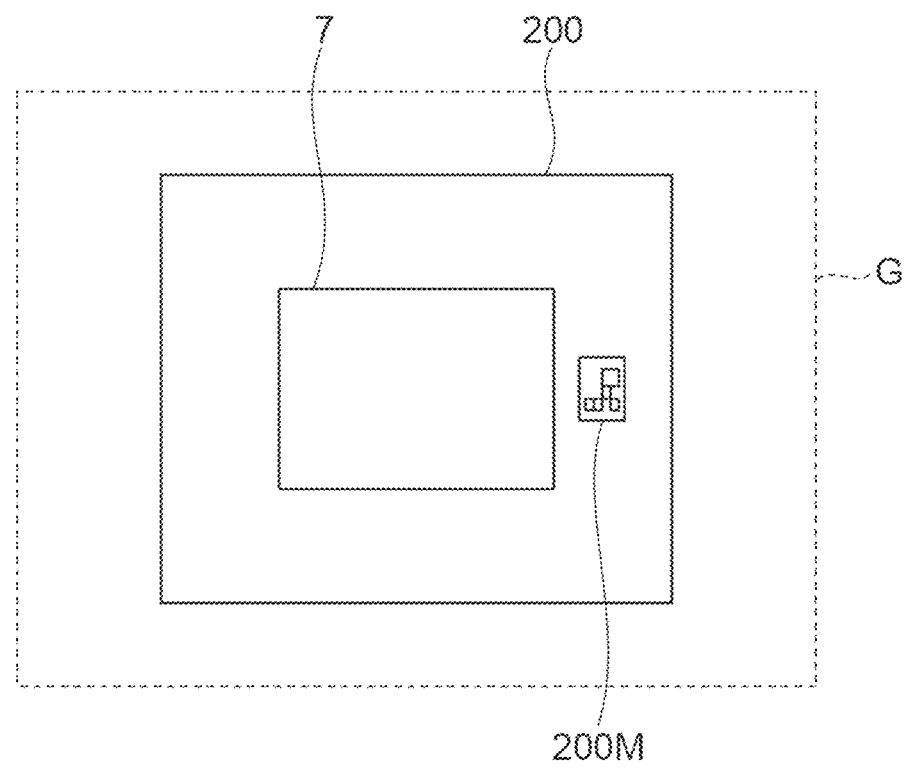
FIG. 5 is a diagram illustrating an image including an AR maker according to a modification of a preferred embodiment of the present invention.

In the above preferred embodiments, at least one of the holding unit 7 and the FOUP 200 held by the holding unit 7 may have an augmented reality (AR) marker and the stereo camera SC may detect the AR marker. For example, as illustrated in FIG. 5, an AR marker 200M may be affixed to the upper portion of the FOUP 200. The AR marker 200M is a type of two-dimensional code and is disposed so that it is reflected in the image G captured by the stereo camera SC. In this case, it is possible to determine at least one of the swaying, tilting, and rotating of the FOUP 200 using the AR marker 200M. The position at which the AR marker 200M is affixed is not particularly limited, and may be within a detection range of the stereo camera SC.

In the above preferred embodiments, the shapes of the holding unit 7 and the FOUP 200 may be recognized from a detection result of the stereo camera SC. In this case, it is possible to determine at least one of the swaying, tilting, and rotating of the FOUP 200 using the recognized shapes of the holding unit 7 and the FOUP 200. In other words, based on the detection result of the stereo camera SC, which includes at least one of the holding unit 7 and the FOUP 200 in its detection range, it is possible to determine at least one of the swaying, tilting, and rotating of the FOUP 200.

In the above preferred embodiments, the gyro sensor and the acceleration sensor may be mounted on the overhead transport vehicle 1 to detect the swaying and tilting of the overhead transport vehicle 1 (i.e., the swaying and tilting of the stereo camera SC). In this case, the detection result of the stereo camera SC may be corrected as appropriate in accordance with the swaying and tilting detected by the gyro sensor and the acceleration sensor. In the above preferred embodiments, the transport vehicle controller 8 is included as the control device, but instead, one or more controllers other than the transport vehicle controller 8 may be included as the control device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An overhead transport vehicle comprising:
a holder to be liftable and lowerable and to hold an article;
a three-dimensional ranging sensor that has a detection range to include surroundings of a lower space directly below the article held by the holder; and
a controller configured or programmed to determine presence or absence of an obstacle based on a detection result of the three-dimensional ranging sensor; wherein
the detection range of the three-dimensional ranging sensor includes at least one of the holder and the article held by the holder;
the controller is configured or programmed to determine at least one of swaying, tilting, and rotating of the article held by the holder based on a detection result of the three-dimensional ranging sensor;
at least one of the holder and the article held by the holder includes a light emitter; and
the three-dimensional ranging sensor is operable to detect light emitted by the light emitter.

2. The overhead transport vehicle according to claim 1, wherein
at least one of the holder and the article held by the holder includes an AR marker; and
the three-dimensional ranging sensor is operable to detect the AR marker.

3. The overhead transport vehicle according to claim 1, wherein the three-dimensional ranging sensor includes a stereo camera.

4. The overhead transport vehicle according to claim 3, wherein the stereo camera is installed at a position above the holder to have an overhead view of the holder and include, in an angle of view, the holder at a lowest position.

5. The overhead transport vehicle according to claim 1, further comprising a lifter to lift and lower the holder; wherein
the three-dimensional ranging sensor is included in the lifter at a position directly above the article held by the holder.

6. The overhead transport vehicle according to claim 1, comprising a gyro sensor and an acceleration sensor that are configured to detect swaying and tilting of the three-dimensional ranging sensor.

* * * * *